Feb. 9, 1960 C. A. BOOKER, JR 2,924,724

TIME DELAY CIRCUITS

Filed April 24, 1957

WITNESSES:

Bernard R. Gieguey

Myron E. Click

INVENTOR

Clyde A. Booker, Jr.

BY

F. E. Browder

ATTORNEY

United States Patent Office 2,924,724
Patented Feb. 9, 1960

2,924,724

TIME DELAY CIRCUITS

Clyde A. Booker, Jr., Churchill Boro, Pa., assignor to Westinghouse Electric Corporation, East Pittsburgh, Pa., a corporation of Pennsylvania Application April 24, 1957, Serial No. 654,942

8 Claims. (Cl. 307—88.5)

This invention relates to time delay circuits in general, and in particular to time delay circuits utilizing transistors.

Time delay circuits usually depend upon the inclusion of capacitive means for a specified delay time. When a capacitive means is used the inherent characteristics of exponential charging or decaying times is reflected generally in exponentially rising or decaying output signals from the time delay circuits. Thus, when a load is to be operated by a predetermined level of output signal after a predetermined delay time, difficulties arise in trying to maintain a coincidence of these two desired conditions. Therefore, it would be desirable to have an output signal from a time delay circuit that has a bistable characteristic, that is, a delayed output signal having a bistable characteristic when plotted as a function of time. It is also desirable at times to have an undelayed output signal available from a time delay circuit, also having a bistable characteristic when plotted as a function of the input voltage or signal, so that it will be possible to tell when the delay period for the time delay circuit starts.

Commercial semiconductor devices having three contact electrodes are very useful in striving for the above characteristics. These devices are small in size, are very durable and appear to have a long useful life. The junction semiconductor or "transistor" comprises, in general, a body of semiconductive material having two zones of one conductivity type separated by a zone of the opposite conductivity type. Thus, the device may be either the N–P–N or P–N–P type. If the transistor is of the P–N–P type, the emitter electrode is normally biased positively to be in a relatively conducting or forward direction and the collector electrode negatively to be in a relatively non-conducting direction, each with respect to the base electrode. For the N–P–N type these polarities are reversed. Junction transistors are preferably to be employed in this invention with the embodiments illustrated herein using the N–P–N type, although P–N–P types may be used.

It is an object of this invention to provide an improved time delay circuit.

Another object of this invention is to provide an improved time delay circuit capable of delivering an undelayed output signal and a delayed output signal.

A further object of this invention is to provide a time delay circuit capable of delivering an undelayed output signal having only two stable conditions and a delayed output signal having a very rapid transition from zero to a full level output.

Other objects of this invention will become apparent from the following description when taken in conjunction with the accompanying drawings. In said drawings, for illustrative purposes only, there are shown preferred forms of this invention.

Figure 1:
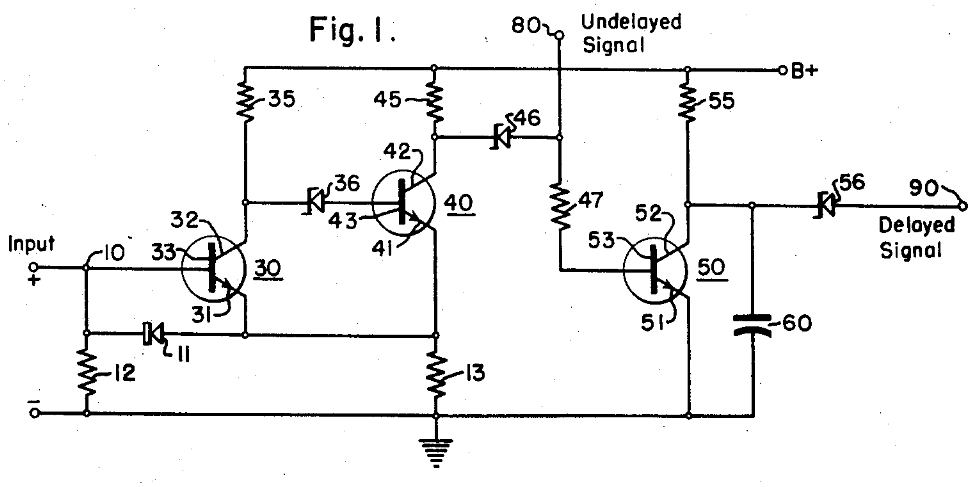
Figure 1 is a schematic diagram of a time delay device embodying the teachings of this invention.

Referring to Fig. 1, there is illustrated a time delay circuit embodying the teachings of this invention wherein an undelayed output signal has the aforementioned bistable characteristic and the delayed output signal has the ordinary exponential characteristic. In general, the apparatus illustrated in Fig. 1 comprises an input means at terminal 10, three stages of semiconductor devices 30, 40 and 50, an output means for an undelayed signal at a terminal 80 and an output means for a delayed signal at a terminal 90.

The first stage semiconductor 30 comprises an emitter electrode 31, a collector electrode 32 and a base electrode 33. The base electrode 33 is connected to the input terminal 10. The emitter electrode 31 is connected to the input terminal 10 via a rectifier 11. The collector electrode 32 is connected to a positive bias voltage supply via a resistor 35. The input terminal 10 is connected to the grounded side of the positive bias voltage through a resistor 12.

The second stage semiconductor 40 comprises an emitter electrode 41, a collector electrode 42 and a base electrode 43. The base electrode 43 of the semiconductor 40 is connected to the collector electrode 32 of the semiconductor 30 through a semiconductor diode 36. The emitter electrode 41 is connected to the grounded side of the positive bias voltage through a resistor 13 and to the emitter electrode 31 of the semiconductor 30.

The third stage semiconductor 50 comprises an emitter electrode 51, a collector electrode 52 and a base electrode 53. The base electrode 53 of the semiconductor 50 is connected to the collector electrode 42 of the semiconductor 40 through a resistor 47 and a semiconductor diode 46. The base electrode 53 is also connected to the terminal 80 through the resistor 47. The emitter electrode 51 of the semiconductor 50 is connected to the grounded side of the positive bias voltage. The collector electrode 52 is connected to a positive bias voltage through a resistor 55. The collector electrode 52 is also connected to the terminal 90 through a semiconductor diode 56. A capacitor 60 connects the emitter electrode 51 and the collector electrode 52.

The positive bias voltage is of sufficient magnitude to break down the semiconductor diodes 36, 46 and 56 and cause current flow in the reverse direction through same. The semiconductor diodes may be of the Zener type.

With no input signal present at the terminal 10 it is seen, as hereinbefore described, that the semiconductor 30 is not properly biased for conduction. If the semiconductor 30 is not conducting the collector electrode 32 will have a potential approximately equal to the potential of the positive bias supply voltage. The semiconductor diode 36 breaks down conduction in the reverse direction, which furnishes a base drive to the base electrode 43 of the semiconductor 40, properly biasing the semiconductor 40 for conduction. When the semiconductor 40 conducts, the potential of the collector electrode 42 will fall from a value close to the value of the positive bias supply to some lower potential depending upon the base drive supplied at the base electrode 43. This potential will be below the breakdown value of the semiconductor diode 46. Therefore, the semiconductor diode 46 will not break down, there will be no reverse conduction and thus no undelayed output signal at the terminal 80. There would also be no base drive present on the base electrode 53 of the semiconductor 50. Hence, the semiconductor 50 will not be conducting. The collector electrode 52 of the semiconductor 50 will be at a potential close to the value of the positive bias supply voltage. This potential will be above the breakdown voltage for the semiconductor diode 56 and there will be an output signal at the terminal 90. For the present we will assume that the capacitor 60 has already been sufficiently charged.

If a positive going input signal is applied to the terminal 10, the semiconductor 30 will start to conduct. With an increase in input voltage at the terminal 10 the potential of the collector electrode 32 of the semiconductor 30 will fall thus reducing the base drive of the semiconductor 40. When the base drive of the semiconductor 40 is reduced, the potential of the emitter electrode 41 will also start to fall. Because of the current gain in the semiconductor 40 the current change in the semiconductor 40 will be greater than the current change in the semiconductor 30. As a result there is a net decrease in current in the resistor 13. Therefore, the potential of the emitter electrode 31 of the semiconductor 30 will be effectively falling and the potential of the base electrode 33 of the semiconductor 30 will be rising. With this positive feedback circuit there is a cascading effect which snaps the semiconductor 30 to saturation and the transistor 40 to cutoff, that is, the change in voltage across the resistor 13 is responsible for the change of current in the base electrode 33 of the semiconductor 30.

It is necessary to restrict the source impedance to the time delay circuit if bistable operation for the undelayed output signal at the terminal 80 is to be obtained. The source impedance is held to a suitably low value by the resistor 12. The maximum value which the source impedance may have is approximately $$R_{12}=(B_1)(B_2)(R_{13})$$

where $B_1$ and $B_2$ are the current gains of the semiconductors 30 and 40, respectively.

When the semiconductor 40 abruptly cuts off, as described above, the potential of the collector electrode 42 will quickly rise above the breakdown value of the semiconductor diode 46 and almost immediately there will be a reverse conduction through the semiconductor 46 and an undelayed bistable output signal will appear at the terminal 80. The breakdown of the semiconductor diode 46 also furnishes a base drive through the resistor 47 to the base electrode 53 of the semiconductor 50. The semiconductor 50 will begin to conduct, reducing the potential of the collector electrode 52 to below the breakdown value of the semiconductor diode 56, and there will be a cessation of output signal at the terminal 90.

Upon removal of the positive input signal at the terminal 10 the semiconductor 30 will revert to its original state and stop conducting. As the input signal decreases it will decrease the base drive of the semiconductor 30 which, in turn, reduces the conduction of the semiconductor 30 allowing the potential of the collector electrode 32 to rise above the breakdown voltage of the semiconductor diode 36. The breakdown of the diode 36 furnishes a base drive to the semiconductor 40 and it begins to conduct. A reverse occurrence of the above-described positive feedback causes a cascading effect which cuts off the semiconductor 30 and snaps the semiconductor 40 into saturation. When the semiconductor 40 starts conducting the potential of the collector electrode 42 will fall to a value below the breakdown voltage of the semiconductor diode 46. The semiconductor diode 46 will stop conducting in the reverse direction and there will be a cessation of the undelayed output signal at the terminal 80 and the base drive to the semiconductor 50. With no base drive the semiconductor 50 stops conducting and the collector electrode 52 begins to rise towards the potential of the positive bias supply voltage. As the potential of the collector 52 rises, the capacitor 60 charges through the resistor 55. No delayed output is obtained from the time delay circuit at terminal 90 until the charging voltage of the capacitor 60 reaches the breakdown voltage of the semiconductor diode 56. At this point, there will be an exponentially rising delayed output voltage to the terminal 90.

Figure 2:
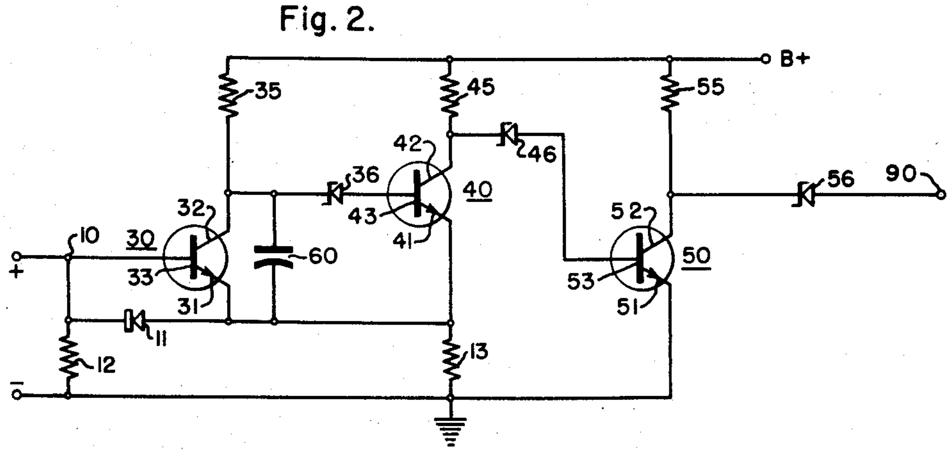
Figure 2 is a schematic diagram of a second embodiment of the teachings of this invention.

Referring to Fig. 2, there is illustrated another embodiment of the teachings of this invention, in which like components of Figs. 1 and 2 have been given the same reference characters. The main distinction between the apparatus illustrated in Figs. 1 and 2 is that in Fig. 2 the capacitor 60 has been moved from the emitter-collector circuit of the semiconductor 50 to the emitter-collector circuit of the semiconductor 30.

In general, the operation of the time delay circuit illustrated in Fig. 2 is similar to the operation of the circuit shown in Fig. 1. With no input at the terminal 10 the semiconductor 30 is not conducting and the potential of the collector 32 is at the potential of the positive bias supply voltage. Assuming that the capacitor 60 has already stored its charge, the semiconductor diode 36 will have broken down, as in the operation of the apparatus of Fig. 1, and will be furnishing a base drive to the semiconductor 40. The semiconductor 40 will be conducting and the potential of the collector electrode 42 will be at some low value below the breakdown point of the semiconductor diode 46. Thus, there will be no base drive for the semiconductor 50, the semiconductor 50 will not be conducting and the potential of the collector electrode 52 will be nearly that of the positive bias supply voltage. The semiconductor diode 56 will have broken down and there will be an output at the terminal 90.

Upon applying a positive going input signal to the terminal 10 the semiconductor 30 will start to conduct. The collector electrode 32 will fall to some potential below the breakdown voltage of the semiconductor diode 36, thus cutting off the base drive of the semiconductor 40. The semiconductor 40 will stop conducting and the collector electrode 42 will rise to nearly the value of the positive bias supply voltage and the semiconductor diode 46 will break down furnishing a base drive for the semiconductor 50. The semiconductor 50 will start to conduct, the potential of the collector electrode 52 will fall below the breakdown value of the semiconductor diode 56 and there will be a cessation of output signal at the terminal 90.

Upon removal of the input to the terminal 10 the semiconductor 30 will stop conducting and the potential of the collector electrode 32 will start to rise. As it rises the capacitor 60 will start to charge through the resistor 35 and at some point the semi-conductor diode 36 will break down to start furnishing a base drive to the semiconductor 40. When the semiconductor 40 starts to conduct the potential of the collector electrode 42 will fall to some point below the breakdown voltage of the semiconductor diode 46, thus cutting off the base drive of the semiconductor 50. The semiconductor 50 will stop conducting, the collector electrode 52 will rise to some potential close to the value of the positive bias supply voltage and the semiconductor diode 56 will break down giving a delayed output signal at the terminal 90.

Once conduction is started by the semiconductor 40 after removal of the input to the terminal 10 the transition in the delayed output signal from zero to a full level output at the terminal 90 is much more rapid than in the case of the apparatus illustrated in Fig. 1. The delay time is still set by the exponential rise in voltage on the capacitor 60 and the decision as to when the proper voltage is reached is still made in the same way. But once a decision is made the output at the terminal 90 charges at a rate which is perhaps 100 times as fast as the output of the apparatus illustrated in Fig. 1. Since the value of the resistor 55 is no longer set by time delay considerations, that is, charging a capacitor in the emitter-collector circuit of the semiconductor 50, the value of the resistor 55 may be made lower which will in turn give a higher output current. Since the delay time is set by the first stage, there is no undelayed output in this circuit.

Figure 3:
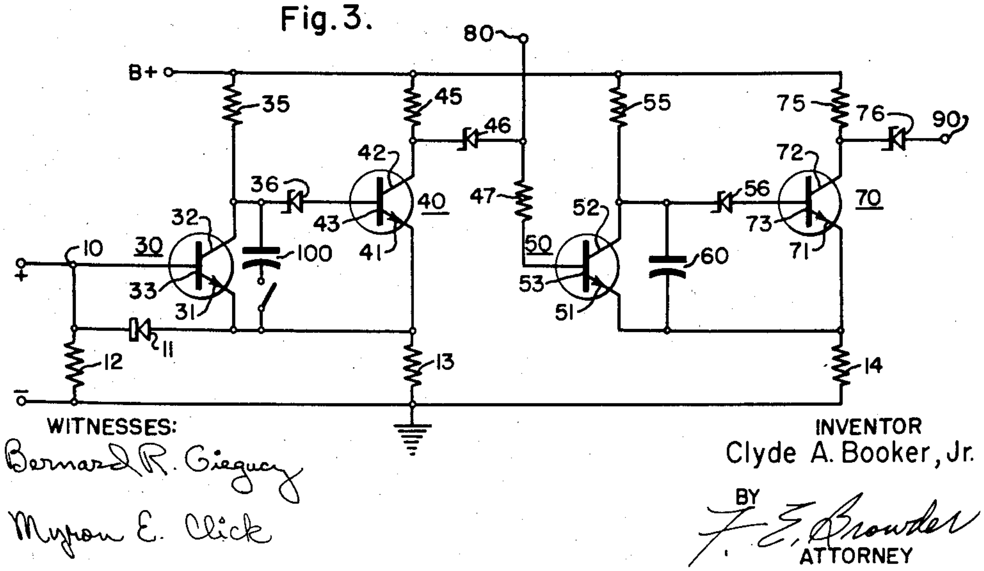
Figure 3 is a third embodiment of the teachings of this invention.

Referring to Fig. 3, there is illustrated a third embodiment of the teachings of this invention, in which like components of Figs. 1 and 3 have been given the same reference characters. The main distinction between the apparatus illustrated in Figs. 1 and 3 is that in Fig. 3 an additional fourth stage containing a semiconductor 70 is added. The fourth stage semiconductor 70 comprises an emitter electrode 70, a collector electrode 72 and a base electrode 73. The base electrode 73 of the semiconductor 70 has been connected to the collector electrode 52 of the semiconductor 50 via the semiconductor diode 56. The emitter electrode 71 of the semiconductor 70 has been connected to the emitter electrode 51 of the semiconductor 50 and also connected to ground through a resistor 14. The collector electrode 72 has been connected to the positive bias voltage supply through a resistor 75 and to the output terminal 90 through a semiconductor diode 76.

In general, the operation of the time delay circuit illustrated in Fig. 3 is similar to the operation of the systems shown in Figs. 1 and 2. That is, the first two stages of the time delay circuit illustrated in Fig. 3 operate in the same manner as the first two stages of the apparatus illustrated in Fig. 1. The third and fourth stage of the circuit illustrated in Fig. 3 operate in the same manner as the first two stages of the apparatus illustrated in Fig. 2. Thus, the operation of the various stages as described in their respective figures applies to the apparatus illustrated in Fig. 3. With no input to the terminal 10 there will be no undelayed output at the terminal 80 and no delayed output at the terminal 90. When a positive going input is applied to the input terminal 10 the first two stages of the apparatus illustrated in Fig. 3 operate in a similar manner to the first two stages of the apparatus illustrated in Fig. 1 and an undelayed output will appear at the terminal 80 and a delayed signal output at the terminal 90. When the input signal is removed from the terminal 10 the undelayed output will cease at the terminal 80 and the delayed output will cease at the terminal 90 at a later time. If desired, a capacitor 100 may be connected across the emitter-collector circuit of semi-conductor 30 where it will effectively filter the input to the time delay circuit without giving the unstable effect of a capacitor when connected to the input proper.

Since the detailed operation of the apparatus illustrated in Fig. 3 is, as described above, similar to the operation of the apparatus illustrated in Figs. 1 and 2, a further description of such operation is deemed unnecessary.

The time delay circuit illustrated in Fig. 3, as is to be expected from combining the desirable characteristics from the Figs. 1 and 2, will give both the undelayed output at the terminal 80 and the delayed output at the terminal 90 essentially bistable characteristics. In the circuits shown a time delay is introduced only upon the removal of a positive input signal. The time delay reset introduced upon the application of a positive input signal is of negligible time duration.

In conclusion, it is pointed out that while the illustrated examples constitute practical embodiments of my invention, I do not limit myself to the exact details shown, since modification of the same may be varied without departing from the spirit of this invention.

I claim as my invention:

1. In a time delay circuit, in combination, a plurality of stages, each said stage comprising a semiconductor device having an emitter, a collector and a base electrode, the input circuit of each said stage including two of said electrodes, the output circuit of each said stage including one of said two electrodes and the third said electrode, coupling means between each of said stages comprising a semiconductor diode, each diode coupling said output circuit of a preceding stage to said input circuit of a next stage only when a predetermined electrode of said preceding stage is at a sufficient magnitude of voltage to cause reverse breakdown of said diode, feedback means connecting the output circuit of a second stage to the input circuit of a first stage, said feedback means comprising an impedance means for measuring the output of said second stage and a unidirectional current device to prevent a current flow from said said input circuit of said first stage to said output circuit of said second stage, capacitive means for storing energy from said output circuit of one of said stages, means for applying a bias to each of said stages, means for applying an input to said time delay circuit, and output means for said time delay circuit.

2. In a time delay circuit, in combination, a plurality of stages, each said stage comprising a semiconductor device having an emitter, a collector and a base electrode, the input circuit of each said stage including two of said electrodes, the output circuit of each said stage including one of said two electrodes and the third said electrode, coupling means between each of said stages comprising a semiconductor diode, each diode coupling said output circuit of a preceding stage to said input circuit of a next stage only when a predetermined electrode of said preceding stage is at a sufficient magnitude of voltage to cause reverse breakdown of said diode feedback means connecting the output circuit of a second stage to the input circuit of a first stage, said feedback means comprising an impedance means for measuring the output of said second stage, a unidirectional current device to prevent current flow from said input circuit of said first stage to said output circuit of said second stage and means for restricting the source impedance of said time delay circuit, capacitive means for storing energy from said output circuit of one of said stages, means for applying a bias to each of said stages, means for applying an input to said time delay circuit, and output means for said time delay circuit.

3. In a time delay circuit, in combination, a plurality of stages, each said stage comprising a semiconductor device having an emitter, a collector and a base electrode, the input circuit of each said stage including two of said electrodes, the output circuit of each said stage including one of said two electrodes and the third said electrode, coupling means between each of said stages comprising a semiconductor diode, each diode coupling said output circuit of a preceding stage to said input circuit of a next stage only when a predetermined electrode of said preceding stage is at a sufficient magnitude of voltage to cause reverse breakdown of said diode feedback means connecting the output circuit of a second stage to the input circuit of a first stage, said feedback means comprising an impedance means for measuring the output of said second stage and a unidirectional current device to prevent a current flow from said input circuit of said first stage to said output circuit of said second stage, capacitive means for storing energy from said output circuit of an output stage of said time delay circuit, means for applying a bias to each of said stages, means for applying an input to said time delay circuit, and output means for said time delay circuit.

4. In a time delay circuit, in combination, a plurality of stages, each said stage comprising a semiconductor device having an emitter, a collector and a base electrode, the input circuit of each said stage including two of said electrodes, the output circuit of each said stage including one of said two electrodes and the third said electrode, coupling means between each of said stages comprising a semiconductor diode, each diode coupling said output circuit of a preceding stage to said input circuit of a next stage only when a predetermined electrode of said preceding stage is at a sufficient magnitude of voltage to cause reverse breakdown of said diode feedback means connecting the output circuit of a second stage to the input circuit of a first stage, said feedback means comprising an impedance means for measuring the output of said second stage and a unidirectional current device to prevent a current flow from said input circuit of said first stage to said output circuit of said second stage, capacitive means for storing energy from said output circuit of an output stage of said time delay circuit, means for applying a bias to each of said stages, means for applying an input to said time delay circuit, and output means for said time delay circuit, said output means comprising output means for an undelayed output signal from said second stage and output means for a delayed output signal from said output stage.

5. In a time delay circuit, in combination, a plurality of stages, each said stage comprising a semiconductor device having an emitter, a collector and a base electrode, the input circuit of each said stages including two of said electrodes, the output circuit of each said stages including one of said two electrodes and the third said electrode, coupling means between each of said stages comprising a semiconductor diode, each diode coupling said output circuit of a preceding stage to said input circuit of a next stage only when a predetermined electrode of said preceding stage is at a sufficient magnitude of voltage to cause reverse breakdown of said diode, feedback means connecting the output circuit of a second stage to the input circuit of a first stage, said feedback means comprising an impedance means for measuring the output of said second stage and a unidirectional current device to prevent a current flow from said input circuit of said first stage to said output circuit of said second stage, capacitive means for storing energy from said output circuit of said first stage, means for applying a bias to each of said stages, means for applying an input to said time delay circuit, and output means for said time delay circuit.

6. In a time delay circuit, in combination, a plurality of stages, each said stage comprising a semiconductor device having an emitter, a collector and a base electrode, the input circuit of each said stage including two of said electrodes, the output circuit of each said stage including one of said two electrodes and the third said electrode, coupling means between each of said stages comprising a semiconductor diode, each diode coupling said output circuit of a preceding stage to said input circuit of a next stage only when a predetermined electrode of said preceding stage is at a sufficient magnitude of voltage to cause reverse breakdown of said diode, feedback means connecting the output circuit of a second stage to the input circuit of a first stage, said feedback means comprising an impedance means for measuring the output of said second stage and a unidirectional current device to prevent a current flow from said input circuit of said first stage to said output circuit of said second stage, capacitive means for storing energy from said output circuit of the next to last stage of said plurality of stages, means for applying a bias to each of said stages, means for applying an input to said time delay circuit, and output means for said time delay circuit.

7. In a time delay circuit, in combination, a plurality of stages, each said stage comprising a semiconductor device having an emitter, a collector and a base electrode, the input circuit of each said stage including two of said electrodes, the output circuit of each said stage including one of said two electrodes and the third said electrode, coupling means between each of said stages comprising a semiconductor diode, each diode coupling said output circuit of a preceding stage to said input circuit of a next stage only when a predetermined electrode of said preceding stage is at a sufficient magnitude of voltage to cause reverse breakdown of said diode, feedback means connecting the output circuit of a second stage to the input circuit of a first stage, said feedback means comprising an impedance means for measuring the output of said second stage and a unidirectional current device to prevent a current flow from said input circuit of said first stage to said output circuit of said second stage, capacitive means for storing energy from said output circuit of the next to last stage of said plurality of stages, means for applying a bias to each of said stages, means for applying an input to said time delay circuit, and output means for said time delay circuit, said output means comprising output means for an undelayed output signal from said second stage and output means for a delayed output signal from said output stage.

8. In a time delay circuit, in combination, a plurality of stages, each said stages comprising a semiconductor device having an emitter, a collector and a base electrode, the input circuit of each said stage including two of said electrodes, the output circuit of each said stage including one of said two electrodes and the third said electrode, coupling means between each of said stages comprising a semiconductor diode, each diode coupling said output circuit of a preceding stage to said input circuit of a next stage only when a predetermined electrode of said preceding stage is at a sufficient magnitude of voltage to cause reverse breakdown of said diode, feedback means connecting the output circuit of a second stage to the input circuit of a first stage, said feedback means comprising an impedance means for measuring the output of said second stage and a unidirectional current device to prevent a current flow from said input circuit of said first stage to said output circuit of said second stage, capacitive means for storing energy from said output circuit of the next to last stage of said plurality of stages, means for filtering the output of said first stage, means for applying a bias to each of said stages, means for applying an input to said time delay circuit, and output means for said time delay circuit, said output means comprising output means for an undelayed output signal from said second stage and output means for a delayed output signal from said output stage.

References Cited in the file of this patent

UNITED STATES PATENTS

| | | |
|---|---|---|
| 2,405,843 | Moe | Aug. 13, 1946 |
| 2,655,609 | Shockley | Oct. 13, 1953 |
| 2,663,800 | Herzog | Dec. 22, 1953 |
| 2,714,702 | Shockley | Aug. 2, 1955 |
| 2,747,111 | Koch | May 22, 1956 |
| 2,772,410 | Logue et al. | Nov. 27, 1956 |
| 2,776,382 | Jensen | Jan. 1, 1957 |
| 2,791,739 | Light | May 7, 1957 |
| 2,845,548 | Silliman et al. | July 29, 1958 |